United States Patent
Saito

(10) Patent No.: US 11,066,326 B2
(45) Date of Patent: Jul. 20, 2021

(54) GLASS

(71) Applicant: Nippon Electric Glass Co., Ltd., Shiga (JP)

(72) Inventor: Atsuki Saito, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 2 days.

(21) Appl. No.: 16/470,765

(22) PCT Filed: Dec. 14, 2017

(86) PCT No.: PCT/JP2017/044919
§ 371 (c)(1),
(2) Date: Jun. 18, 2019

(87) PCT Pub. No.: WO2018/116953
PCT Pub. Date: Jun. 28, 2018

(65) Prior Publication Data
US 2019/0345055 A1 Nov. 14, 2019

(30) Foreign Application Priority Data

Dec. 20, 2016 (JP) ............... JP2016-246579
Mar. 6, 2017 (JP) ............... JP2017-041661

(51) Int. Cl.
*C03C 3/091* (2006.01)

(52) U.S. Cl.
CPC .................... *C03C 3/091* (2013.01)

(58) Field of Classification Search
CPC ...................................... C03C 3/091
See application file for complete search history.

(56) References Cited

U.S. PATENT DOCUMENTS

| | | | | |
|---|---|---|---|---|
| 7,833,919 B2 * | 11/2010 | Danielson | ............... | C03C 3/095 501/66 |
| 9,051,206 B2 * | 6/2015 | Allan | ............... | C03C 3/091 |
| 9,061,938 B2 * | 6/2015 | Kawaguchi | ............... | C03C 3/091 |
| 10,590,026 B2 * | 3/2020 | Saito | ............... | C03B 5/027 |
| 2007/0191207 A1 | 8/2007 | Danielson et al. | | |
| 2011/0048074 A1 | 3/2011 | Danielson et al. | | |
| 2013/0065747 A1 | 3/2013 | Danielson et al. | | |
| 2013/0225390 A1 | 8/2013 | Ellison et al. | | |
| 2013/0237401 A1 | 9/2013 | Kawaguchi et al. | | |
| 2013/0244859 A1 | 9/2013 | Kawaguchi et al. | | |
| 2013/0296157 A1 | 11/2013 | Ellison et al. | | |
| 2014/0049708 A1 | 2/2014 | Murata et al. | | |
| 2014/0179510 A1 | 6/2014 | Allan et al. | | |
| 2014/0243186 A1 | 8/2014 | Danielson et al. | | |
| 2014/0249017 A1 | 9/2014 | Allan et al. | | |
| 2015/0093561 A1 * | 4/2015 | Tokunaga | ............... | C03C 3/091 428/220 |
| 2015/0175474 A1 | 6/2015 | Ellison et al. | | |
| 2015/0259241 A1 | 9/2015 | Allan et al. | | |
| 2016/0039708 A1 | 2/2016 | Ellison et al. | | |
| 2016/0168013 A1 | 6/2016 | Allan et al. | | |
| 2017/0144918 A1 | 5/2017 | Allan et al. | | |
| 2018/0141849 A1 * | 5/2018 | Saito | ............... | C03C 3/11 |

FOREIGN PATENT DOCUMENTS

| | | | | |
|---|---|---|---|---|
| EP | 0787693 A1 * | 8/1997 | ............. | C03C 1/004 |
| JP | 2002003240 A * | 1/2002 | ............. | C03C 3/091 |
| JP | 2009-525942 | 7/2009 | | |
| JP | 2010215463 A * | 9/2010 | ............. | C03C 3/097 |
| JP | 2012-41217 | 3/2012 | | |
| JP | 2012121738 A * | 6/2012 | | |
| JP | 2012-236759 | 12/2012 | | |
| JP | 2014-503465 | 2/2014 | | |
| JP | 2015-512849 | 4/2015 | | |
| JP | 2016-505502 | 2/2016 | | |
| WO | WO-9711919 A1 * | 4/1997 | ............. | C03C 3/093 |
| WO | 2007/095115 | 8/2007 | | |
| WO | 2012/063643 | 5/2012 | | |

OTHER PUBLICATIONS

International Search Report dated Mar. 6, 2018 in International (PCT) Application No. PCT/JP2017/044919.

* cited by examiner

*Primary Examiner* — Karl E Group

(74) *Attorney, Agent, or Firm* — Wenderoth, Lind & Ponack, L.L.P.

(57) ABSTRACT

A glass of the present invention includes as a glass composition, in terms of mass %, 55% to 70% of $SiO_2$, 15% to 25% of $Al_2O_3$, 1% to 5% of $B_2O_3$, 0% to 0.5% of $Li_2O+Na_2O+K_2O$, 0% to 4% of MgO, 3% to 11% of CaO, 0% to 4% of SrO, and 0% to 11% of BaO, and has a strain point of more than 715° C.

9 Claims, No Drawings

GLASS

TECHNICAL FIELD

The present invention relates to a glass, and more specifically, to a glass suitable as a substrate for an OLED display.

BACKGROUND ART

An electronic device, such as an OLED display, is used in applications such as displays of cellular phones because the electronic device is thin, is excellent in displaying a moving image, and has low power consumption.

A glass sheet is widely used as a substrate for an OLED display. The glass sheet of this application is mainly required to satisfy the following characteristics.
(1) To have small contents of alkali metal oxides in order to prevent a situation in which alkali ions are diffused into a semiconductor substance having been formed into a film in a heat treatment step.
(2) To be excellent in productivity, particularly in devitrification resistance and meltability, in order to achieve a reduction in cost of the glass sheet.
(3) To have a high strain point in order to reduce thermal shrinkage in a production process for a p-Si TFT.
(4) To have a high specific Young's modulus in order to reduce deflection under its own weight in a conveyance step.

CITATION LIST

Patent Literature

Patent Literature 1: JP 2009-525942 A

SUMMARY OF INVENTION

Technical Problem

The above-mentioned item (3) is described in detail. The production process for a p-Si TFT includes a heat treatment step at from 400° C. to 600° C., and in the heat treatment step, the glass sheet causes a minute dimensional change called thermal shrinkage. When the thermal shrinkage is large, a TFT pixel pitch shift occurs, which results in a display defect. In the case of an OLED display, even a dimensional shrinkage of about several ppm may result in a display defect, and hence there is a demand for a glass sheet exhibiting less thermal shrinkage. As a heat treatment temperature of the glass sheet becomes higher, the thermal shrinkage is increased more.

As a method of reducing the thermal shrinkage of the glass sheet, there is given a method involving, after forming the glass sheet, performing annealing treatment at around an annealing point. However, the annealing treatment takes a long time period, and hence the production cost of the glass sheet is increased.

As another method, there is given a method involving increasing the strain point of the glass sheet. As the strain point becomes higher, the thermal shrinkage is less liable to occur in the production process for a p-Si TFT. For example, in Patent Literature 1, there is disclosed a glass sheet having a high strain point. However, when the strain point is high, productivity is liable to be reduced.

The present invention has been made in view of the above-mentioned circumstances, and a technical object of the present invention is to devise a glass which is excellent in productivity (particularly devitrification resistance) and has a high specific Young's modulus, and besides, exhibits less thermal shrinkage in a production process for a p-Si TFT.

Solution to Problem

The inventor of the present invention has repeatedly performed various experiments. As a result, the inventor has found that the technical object can be achieved by strictly restricting a glass composition and a strain point of low-alkali glass or alkali-free glass. Thus, the inventor proposes the finding as the present invention. That is, according to one embodiment of the present invention, there is provided a glass, comprising as a glass composition, in terms of mass %, 55% to 70% of $SiO_2$, 15% to 25% of $Al_2O_3$, 1% to 5% of $B_2O_3$, 0% to 0.5% of $Li_2O+Na_2O+K_2O$, 0% to 4% of MgO, 3% to 11% of CaO, 0% to 4% of SrO, and 0% to 11% of BaO, and having a strain point of more than 715° C. Herein, the content of "$Li_2O+Na_2O+K_2O$" refers to the total content of $Li_2O$, $Na_2O$, and $K_2O$. The "strain point" refers to a value measured in accordance with a method of ASTM C336.

Secondly, it is preferred that the glass according to the embodiment of the present invention comprise as a glass composition, in terms of mass %, 55% to 70% of $SiO_2$, 15% to 25% of $Al_2O_3$, 1.5% to 4% of $B_2O_3$, 0% to less than 0.1% of $Li_2O+Na_2O+K_2O$, 0% to 3% of MgO, 4% to 10% of CaO, 1% to 4% of SrO, and 4% to 11% of BaO.

Thirdly, it is preferred that the glass according to the embodiment of the present invention have a ratio of $SiO_2$/$Al_2O_3$ in terms of mass % of from 2.5 to 3.1.

Fourthly, it is preferred that the glass according to the embodiment of the present invention have a ratio of CaO/BaO in terms of mass % of 4.0 or less.

Fifthly, it is preferred that the glass according to the embodiment of the present invention further comprise 0.001 mass % to 1 mass % of $SnO_2$.

Sixthly, it is preferred that the glass according to the embodiment of the present invention have a specific Young's modulus, that is, a value obtained by dividing a Young's modulus by a density, of more than 29.5 GPa/g·cm$^{-3}$.

Seventhly, it is preferred that the glass according to the embodiment of the present invention have a temperature at a viscosity at high temperature of $10^{2.5}$ dPa·s of 1,650° C. or less. Herein, the "temperature at a viscosity at high temperature of $10^{2.5}$ dPa·s" may be measured by a platinum sphere pull up method.

Eighthly, it is preferred that the glass according to the embodiment of the present invention have a liquidus temperature of less than 1,310° C. Herein, the "liquidus temperature" may be calculated by measuring a temperature at which a crystal precipitates when glass powder which has passed through a standard 30-mesh sieve (500 μm) and remained on a 50-mesh sieve (300 μm) is placed in a platinum boat and then kept for 24 hours in a gradient heating furnace.

Ninthly, it is preferred that the glass according to the embodiment of the present invention have a viscosity at a liquidus temperature of $10^{4.2}$ dPa·s or more. Herein, the "viscosity at a liquidus temperature" may be measured by a platinum sphere pull up method.

Tenthly, it is preferred that the glass according to the embodiment of the present invention have a flat sheet shape and comprise overflow-joined surfaces in a middle portion thereof in a sheet thickness direction. That is, it is preferred that the glass according to the embodiment of the present invention be formed by an overflow down-draw method.

Eleventhly, it is preferred that the glass according to the embodiment of the present invention be used for an OLED device.

DESCRIPTION OF EMBODIMENTS

A glass of the present invention comprises as a glass composition, in terms of mass %, 55% to 70% of $SiO_2$, 15% to 25% of $Al_2O_3$, 1% to 5% of $B_2O_3$, 0% to 0.5% of $Li_2O+Na_2O+K_2O$, 0% to 4% of MgO, 3% to 11% of CaO, 0% to 4% of SrO, and 0% to 11% of BaO. The reasons why the contents of the components are restricted as described above are hereinafter described. In the descriptions of the contents of the components, the expression "%" refers to "mass %" unless otherwise specified.

$SiO_2$ is a component which forms a glass skeleton and increases a strain point. The content of $SiO_2$ is from 55% to 70%, preferably from 58% to 64%, particularly preferably from 59% to 62%. When the content of $SiO_2$ is small, the strain point or acid resistance is liable to be reduced, and a density is liable to be increased. Meanwhile, when the content of $SiO_2$ is large, a viscosity at high temperature is increased, and thus meltability is liable to be reduced. Besides, a glass component balance is lost, and thus a devitrified crystal, such as cristobalite, precipitates, with the result that a liquidus temperature is liable to be increased. Further, an etching rate in HF is liable to be reduced.

$Al_2O_3$ is a component which increases the strain point. Further, $Al_2O_3$ is also a component which increases a Young's modulus. The content of $Al_2O_3$ is from 15% to 25%, preferably from 17% to 23%, particularly preferably from 18% to 22%. When the content of $Al_2O_3$ is small, the strain point or a specific Young's modulus is liable to be reduced. Meanwhile, when the content of $Al_2O_3$ is large, mullite or a feldspar-based devitrified crystal precipitates, with the result that the liquidus temperature is liable to be increased.

The ratio of $SiO_2/Al_2O_3$ in terms of mass % is an important component ratio for achieving both a high strain point and high devitrification resistance. These components each have an increasing effect on the strain point as described above, but when the amount of $SiO_2$ is relatively increased, a devitrified crystal, such as cristobalite, is liable to precipitate. Meanwhile, when the amount of $Al_2O_3$ is relatively increased, an alkaline earth aluminosilicate-based devitrified crystal, such as mullite or anorthite, is liable to precipitate. Therefore, the ratio of $SiO_2/Al_2O_3$ in terms of mass % is preferably from 2.5 to 4, from 2.6 to 3.5, or from 2.7 to 3.3, particularly preferably from 2.7 to 3.1.

$B_2O_3$ is a component which increases the meltability and the devitrification resistance. The content of $B_2O_3$ is from 1% to 5%, preferably from 1.5% to 4% or more than 1.5% to 3%, particularly preferably from 2% to less than 3%. When the content of $B_2O_3$ is small, the meltability is liable to be reduced, and the liquidus temperature is liable to be increased. Further, buffered hydrofluoric acid resistance (BHF resistance) is liable to be reduced. Meanwhile, when the content of $B_2O_3$ is large, the strain point, the acid resistance, and the specific Young's modulus are liable to be reduced. In addition, water is liable to be mixed in the glass from a raw material for introducing $B_2O_3$, and a β-OH value is liable to be increased. When the strain point is to be increased to the extent possible, the content of $B_2O_3$ is preferably from 1% to less than 3%. In addition, when the meltability is to be increased to the extent possible, the content of $B_2O_3$ is preferably more than 3% to 5%.

$Li_2O$, $Na_2O$, and $K_2O$ are each a component which increases the meltability and reduces the electrical resistivity of molten glass. However, when $Li_2O$, $Na_2O$, and $K_2O$ are incorporated in large amounts, there is a risk in that a semiconductor substance is contaminated owing to diffusion of alkali ions. Therefore, the content of $Li_2O+Na_2O+K_2O$ is from 0% to 0.5%, preferably from 0.01% to 0.3% or from 0.02% to 0.2%, particularly preferably from 0.03% to less than 0.1%. In addition, the content of $Na_2O$ is preferably from 0% to 0.3%, from 0.01% to 0.3%, or from 0.02% to 0.2%, particularly preferably from 0.03% to less than 0.1%.

MgO is a component which increases the meltability and the Young's modulus. The content of MgO is from 0% to 4%, preferably from 0% to 3% or from 1% to 3%, particularly preferably from 2% to 3%. When the content of MgO is small, it becomes difficult to ensure stiffness, and the meltability is liable to be reduced. Meanwhile, when the content of MgO is large, a devitrified crystal, such as mullite or cristobalite, is liable to precipitate, and there is a risk in that the strain point is significantly reduced.

CaO is a component which reduces the viscosity at high temperature and thus remarkably increases the meltability without reducing the strain point. In addition, a raw material for introducing CaO is relatively inexpensive among those for alkaline earth metal oxides, and hence CaO is a component which achieves a reduction in raw material cost. Further, CaO is also a component which increases the Young's modulus. The content of CaO is from 3% to 11%, preferably from 4% to 10% or from 5% to 10%, particularly preferably from 5% to 9%. When the content of CaO is small, it is difficult to exhibit the above-mentioned effects. Meanwhile, when the content of CaO is large, the glass is liable to be devitrified, and the density is liable to be increased.

SrO is a component which suppresses phase separation and increases the devitrification resistance. Further, SrO is also a component which reduces the viscosity at high temperature and thus increases the meltability without reducing the strain point. However, when the content of SrO is large, the glass component balance is lost, and thus a feldspar-based devitrified crystal is liable to precipitate, and the devitrification resistance is liable to be reduced contrarily. Therefore, the content of SrO is from 0% to 4%, preferably from 0% to 3% or from 0% to 2.5%, particularly preferably from 0.5% to 2.5%.

BaO is a component which has a high suppressing effect on the precipitation of a mullite-based or anorthite-based devitrified crystal, among alkaline earth metal oxides. The content of BaO is preferably from 0% to 11%, from 2% to 11%, from 3% to 11%, or from 4% to 9%, particularly preferably from 5% to 8%. When the content of BaO is small, the mullite-based or anorthite-based devitrified crystal is liable to precipitate. Meanwhile, when the content of BaO is large, a devitrified crystal containing Ba is liable to precipitate. In addition, the viscosity at high temperature is excessively increased, and thus the meltability is liable to be reduced.

The ratio of CaO/BaO in terms of mass % is an important component ratio for reducing a precipitation temperature of an anorthite crystal. The ratio of CaO/BaO in terms of mass % is preferably 4.0 or less, 3.5 or less, 3.0 or less, or 2.5 or less, particularly preferably from 0.1 to 2.0.

Other than the above-mentioned components, for example, the following components may be added.

ZnO is a component which increases the meltability. However, when ZnO is incorporated in a large amount, the glass is liable to devitrify, and the strain point is liable to be reduced. Therefore, the content of ZnO is preferably from 0% to 5%, from 0% to 3%, or from 0% to 0.5%, particularly preferably from 0% to 0.2%.

$P_2O_5$ is a component which increases the strain point. However, when $P_2O_5$ is incorporated in a large amount, the glass is liable to undergo phase separation. Therefore, the content of $P_2O_5$ is preferably from 0% to 1.5% or from 0% to 1.2%, particularly preferably from 0% to less than 0.1%.

$TiO_2$ is a component which reduces the viscosity at high temperature and thus increases the meltability, and is also a component which suppresses solarization resistance. However, when $TiO_2$ is incorporated in a large amount, the glass is colored, and thus a transmittance is liable to be reduced. Therefore, the content of $TiO_2$ is preferably from 0% to 5%, from 0% to 3%, or from 0% to 1%, particularly preferably from 0% to 0.02%.

$ZrO_2$, $Y_2O_3$, $Nb_2O_5$, and $La_2O_3$ each have an action of increasing the strain point, the Young's modulus, and the like. However, when the contents of those components are large, the density is liable to be increased. Therefore, the content of each of $ZrO_2$, $Y_2O_3$, $Nb_2O_5$, and $La_2O_3$ is preferably from 0% to 5%, from 0% to 3%, from 0% to 1%, or from 0% to less than 0.1%, particularly preferably from 0% to less than 0.05%. Further, the total content of $Y_2O_3$ and $La_2O_3$ is preferably less than 0.1%.

$Fe_2O_3$ is a component which reduces the electrical resistivity of the molten glass. The content of $Fe_2O_3$ is preferably from 0.001% to 0.1% or from 0.005% to 0.05%, particularly preferably from 0.008% to 0.015%. When the content of $Fe_2O_3$ is small, it becomes difficult to exhibit the above-mentioned effect. Meanwhile, when the content of $Fe_2O_3$ is large, the transmittance of a glass sheet is liable to be reduced. When electric melting is performed, it is preferred to positively introduce $Fe_2O_3$. In this case, the content of $Fe_2O_3$ is preferably from 0.005% to 0.03% or from 0.008% to 0.025%, particularly preferably from 0.01% to 0.02%.

$SnO_2$ is a component which exhibits a satisfactory fining action in a high temperature region. In addition, $SnO_2$ is a component which increases the strain point, and is also a component which reduces the viscosity at high temperature. The content of $SnO_2$ is preferably from 0% to 1%, from 0.001% to 1%, or from 0.01% to 0.5%, particularly preferably from 0.05% to 0.3%. When the content of $SnO_2$ is large, a devitrified crystal of $SnO_2$ is liable to precipitate. When the content of $SnO_2$ is small, it becomes difficult to exhibit the above-mentioned effects.

$F_2$, $Cl_2$, $SO_3$, C, or metal powder, such as Al powder or Si powder, may be added at up to 5% as a fining agent as long as glass characteristics are not impaired. In addition, $CeO_2$ or the like may also be added at up to 1% as a fining agent.

$As_2O_3$ and $Sb_2O_3$ each act effectively as a fining agent. However, from an environmental viewpoint, it is preferred to use those components as little as possible, while the glass of the present invention does not completely exclude the introduction of those components. Further, when $As_2O_3$ is incorporated in a large amount in the glass, the solarization resistance tends to be reduced. Therefore, the content of $As_2O_3$ is preferably 0.1% or less, and the glass is desirably substantially free of $As_2O_3$. Herein, the "substantially free of $As_2O_3$" refers to a case in which the content of $As_2O_3$ in the glass composition is less than 0.05%. In addition, the content of $Sb_2O_3$ is preferably 0.2% or less, particularly preferably 0.1% or less, and the glass is desirably substantially free of $Sb_2O_3$. Herein, the "substantially free of $Sb_2O_3$" refers to a case in which the content of $Sb_2O_3$ in the glass composition is less than 0.05%.

Cl has a promoting effect on the melting of low-alkali glass. When Cl is added, a melting temperature can be reduced, and the action of the fining agent can be promoted. In addition, Cl has a reducing effect on the β-OH value of the molten glass. However, when the content of Cl is too large, the strain point is liable to be reduced. Therefore, the content of Cl is preferably 0.5% or less, particularly preferably from 0.001% to 0.2%. As a raw material for introducing Cl, a raw material such as a chloride of an alkaline earth metal, such as strontium chloride, or aluminum chloride may be used.

The glass of the present invention preferably has the following glass characteristics.

In the glass of the present invention, the strain point is more than 715° C., preferably 720° C. or more or 730° C. or more, particularly preferably from 740° C. to 850° C. When the strain point is low, a glass sheet is liable to cause thermal shrinkage in a production process for a p-Si TFT.

The density is preferably 2.65 g/cm³ or less or 2.60 g/cm³ or less, particularly preferably 2.57 g/cm³ or less. When the density is large, the specific Young's modulus is decreased, and the glass is liable to be deflected under its own weight.

The average thermal expansion coefficient within a temperature range of from 30° C. to 380° C. is preferably from $33\times10^{-7}/°$ C. to $43\times10^{-7}/°$ C., particularly preferably from $35\times10^{-7}/°$ C. to $39\times10^{-7}/°$ C. When the average thermal expansion coefficient within a temperature range of from 30° C. to 380° C. is outside the above-mentioned range, the average thermal expansion coefficient does not match the thermal expansion coefficient of a peripheral member, and peeling of the peripheral member or warpage of the glass sheet is liable to occur. Herein, the "average thermal expansion coefficient within a temperature range of from 30° C. to 380° C." refers to a value measured with a dilatometer.

The etching rate in HF is preferably 0.8 μm/min or more or 0.9 μm/min or more, particularly preferably 1 μm/min or more. When the etching rate in HF is low, it becomes difficult to reduce the thickness of the glass sheet in a slimming step. Herein, the "etching rate in HF" refers to a value calculated from an etching depth when, after part of a surface of a mirror-polished glass is masked with a polyimide tape, the glass is etched in a 5 mass % HF aqueous solution at 20° C. under the conditions of 30 minutes.

The liquidus temperature is preferably less than 1,310° C. or 1,280° C. or less, particularly preferably 1,260° C. or less. When the liquidus temperature is high, a devitrified crystal is generated during forming by an overflow down-draw method or the like, and the productivity of the glass sheet is liable to be reduced.

The viscosity at a liquidus temperature is preferably $10^{4.2}$ dPa·s or more, $10^{4.4}$ dPa·s or more, $10^{4.5}$ dPa·s or more, or $10^{4.6}$ dPa·s or more, particularly preferably $10^{4.8}$ dPa·s or more. When the viscosity at a liquidus temperature is low, a devitrified crystal is generated during forming by an overflow down-draw method or the like, and the productivity of the glass sheet is liable to be reduced.

The temperature at a viscosity at high temperature of $10^{2.5}$ dPa·s is preferably 1,650° C. or less, 1,620° C. or less, or 1,610° C. or less, particularly preferably 1,600° C. or less. When the temperature at a viscosity at high temperature of $10^{2.5}$ dPa·s is high, it becomes difficult to melt the glass, and the production cost of the glass sheet is increased.

The specific Young's modulus is preferably more than 29.5 GPa/g·cm⁻³, 30 GPa/g·cm⁻³ or more, or 30.5 GPa/g·cm⁻³ or more, particularly preferably 31 GPa/g·cm⁻³ or more. When the specific Young's modulus is low, the glass sheet is liable to be deflected under its own weight.

In the glass of the present invention, the strain point can be increased by reducing a β-OH value. The β-OH value is preferably 0.30/mm or less, 0.25/mm or less, or 0.20/mm or less, particularly preferably 0.15/mm or less. When the β-OH value is too large, the strain point is liable to be reduced. When the β-OH value is too small, the meltability is liable to be reduced. Therefore, then β-OH value is preferably 0.01/mm or more, particularly preferably 0.05/mm or more.

A method of reducing the β-OH value is exemplified by the following methods: (1) a method involving selecting raw materials having low water contents; (2) a method involving adding a component (such as Cl or $SO_3$) which reduces the water content in the glass; (3) a method involving reducing the water content in a furnace atmosphere; (4) a method involving performing $N_2$ bubbling in the molten glass; (5) a method involving adopting a small melting furnace; (6) a method involving increasing the flow rate of the molten glass; and (7) a method involving adopting an electric melting method.

Herein, the "β-OH value" refers to a value determined by using the following equation after measuring the transmittances of the glass with an FT-IR.

$$\beta\text{-OH value}=(1/X)\log(T_1/T_2)$$

X: Glass thickness (mm)
$T_1$: Transmittance (%) at a reference wavelength of 3,846 $cm^{-1}$
$T_2$: Minimum transmittance (%) at a wavelength around a hydroxyl group absorption wavelength of 3,600 $cm^{-1}$ It is preferred that the glass of the present invention have a flat sheet shape and comprise overflow-joined surfaces in a middle portion thereof in a sheet thickness direction. That is, it is preferred that the glass of the present invention be formed by an overflow down-draw method. The overflow down-draw method refers to a method in which molten glass is caused to overflow from both sides of a wedge-shaped refractory, and the overflowing molten glasses are subjected to down-draw downward at the lower end of the wedge-shaped refractory while being joined, to thereby form a glass in a flat sheet shape. By the overflow down-draw method, surfaces which are to serve as the surfaces of a glass sheet are formed in a state of free surfaces without being brought into contact with the refractory. As a result, a glass sheet having good surface quality can be produced without polishing at low cost, and an increase in area and a reduction in thickness are easily achieved as well.

Other than the overflow down-draw method, the glass sheet may also be formed by, for example, a slot down method, a redraw method, a float method, or a roll-out method.

In the glass of the present invention, the thickness (in the case of having a flat sheet shape, a sheet thickness) is not particularly limited, but is preferably 1.0 mm or less, 0.7 mm or less, or 0.5 mm or less, particularly preferably 0.4 mm or less. As the sheet thickness becomes smaller, the weight of an OLED device can be reduced more easily. The thickness may be adjusted by controlling, for example, a flow rate and a sheet-drawing speed at the time of glass production.

As a method of industrially producing the glass of the present invention, there is preferably given a method of producing a glass sheet comprising as a glass composition, in terms of mass %, 55% to 70% of $SiO_2$, 15% to 25% of $Al_2O_3$, 1% to 5% of $B_2O_3$, 0% to 0.5% of $Li_2O+Na_2O+K_2O$, 0% to 4% of MgO, 3% to 11% of CaO, 0% to 4% of SrO, and 0% to 11% of BaO, and having a strain point of more than 715° C., the method comprising: a melting step of loading a blended glass batch into a melting furnace and heating the blended glass batch through application of a current with a heating electrode to provide molten glass; and a forming step of forming the resultant molten glass into a glass in a flat sheet shape having a sheet thickness of from 0.1 mm to 0.7 mm by an overflow down-draw method.

In general, a production process for the glass sheet comprises a melting step, a fining step, a supplying step, a stirring step, and a forming step. The melting step is a step of melting a glass batch obtained by blending glass raw materials to provide molten glass. The fining step is a step of fining the molten glass obtained in the melting step by an action of a fining agent or the like. The supplying step is a step of transferring the molten glass from one step to another. The stirring step is a step of stirring the molten glass to homogenize the molten glass. The forming step is a step of forming the molten glass into a glass in a flat sheet shape. A step other than the above-mentioned steps, for example, a state adjusting step of adjusting the molten glass to be in a state suitable for forming may be introduced after the stirring step as required.

When the conventional low-alkali glass is industrially produced, the melting has been generally performed by heating with combustion burner flame. A burner is generally arranged at an upper portion of a melting kiln, and uses fossil fuel as its fuel, specifically, for example, liquid fuel, such as heavy oil, or gas fuel, such as LPG. The combustion flame may be obtained by mixing the fossil fuel and oxygen gas. However, such method is liable to entail an increase in β-OH value because a large amount of water is mixed in the molten glass during the melting. Therefore, in the production of the glass of the present invention, it is preferred to perform heating through application of a current with a heating electrode, and it is more preferred to perform the melting by only heating through application of a current with a heating electrode without heating with combustion burner flame. With this, water is less liable to be mixed in the molten glass during the melting, and hence the β-OH value is easily controlled to 0.40/mm or less, 0.30/mm or less, or 0.20/mm or less, particularly 0.15/mm or less. Further, when the heating through application of a current with a heating electrode is performed, the amount of energy required for obtaining the molten glass per unit mass is reduced, and the amount of a melt volatile is reduced. As a result, an environmental load can be reduced.

The heating through application of a current with a heating electrode is preferably performed by applying an alternating voltage to a heating electrode arranged at a bottom portion or a side portion of a melting kiln so as to be brought into contact with the molten glass in the melting kiln. A material used for the heating electrode preferably has heat resistance and corrosion resistance to the molten glass. For example, tin oxide, molybdenum, platinum, or rhodium may be used, and molybdenum is particularly preferred.

The glass of the present invention has a small content of an alkali metal oxide, and hence has a high electrical resistivity as compared to that of a high-alkali-containing glass. Therefore, when the heating through application of a current with a heating electrode is applied to the low-alkali glass, there is a risk in that the current flows not only in the molten glass but also in a refractory constituting the melting kiln, with the result that the refractory constituting the melting kiln is damaged early. In order to prevent such situation, it is preferred to use, as a refractory in a furnace, a zirconia-based refractory having a high electrical resistivity, particularly zirconia electrocast bricks. In addition, it is preferred to introduce a component which reduces the electrical resistivity ($Li_2O$, $Na_2O$, $K_2O$, $Fe_2O_3$, or the like) in the molten glass (glass composition) in a small amount. In particular, it is preferred to introduce $Li_2O$, $Na_2O$, $K_2O$, or the like in a small amount. In addition, the content of $Fe_2O_3$ is preferably from 0.005 mass % to 0.03 mass % or from 0.008 mass % to 0.025 mass %, particularly preferably from 0.01 mass % to 0.02 mass %. Further, the content of $ZrO_2$ in the zirconia-based refractory is preferably 85 mass % or more, particularly preferably 90 mass % or more.

Examples

The present invention is hereinafter described by way of Examples.

Examples of the present invention (Sample Nos. 1 to 32) are shown in Tables 1 and 2. In the tables, the "N.A." means that the item is not measured. The content of $Fe_2O_3$ in each sample is not explicitly shown in the tables, but each sample contains 0.001 mass % to 0.008 mass % of $Fe_2O_3$ in a glass composition as a minor component. In addition, the β-OH value in each sample is not explicitly shown in the tables, but was from 0.05/mm to 0.15/mm.

TABLE 1

| Composition (mass %) | No. 1 | No. 2 | No. 3 | No. 4 | No. 5 | No. 6 | No. 7 | No. 8 |
|---|---|---|---|---|---|---|---|---|
| $SiO_2$ | 61.6 | 61.7 | 61.0 | 60.4 | 61.2 | 61.0 | 60.9 | 60.6 |
| $Al_2O_3$ | 20.6 | 20.6 | 21.1 | 21.7 | 20.5 | 20.4 | 20.4 | 20.3 |
| $B_2O_3$ | 3.5 | 2.5 | 3.5 | 2.4 | 3.5 | 2.5 | 3.5 | 2.4 |
| $Li_2O$ | 0.00 | 0.00 | 0.00 | 0.00 | 0.00 | 0.00 | 0.00 | 0.00 |
| $Na_2O$ | 0.00 | 0.00 | 0.00 | 0.00 | 0.00 | 0.00 | 0.00 | 0.03 |
| $K_2O$ | 0.00 | 0.00 | 0.00 | 0.00 | 0.00 | 0.00 | 0.00 | 0.00 |
| MgO | 1.0 | 1.0 | 1.0 | 1.0 | 1.3 | 1.6 | 1.6 | 1.9 |
| CaO | 7.8 | 8.7 | 6.9 | 6.9 | 7.0 | 6.9 | 6.1 | 6.1 |
| SrO | 2.5 | 2.5 | 2.4 | 2.4 | 2.4 | 2.4 | 2.4 | 2.4 |
| BaO | 2.7 | 2.7 | 3.8 | 4.9 | 3.8 | 5.0 | 5.0 | 6.1 |
| ZnO | 0.0 | 0.0 | 0.0 | 0.0 | 0.0 | 0.0 | 0.0 | 0.0 |
| $SnO_2$ | 0.2 | 0.2 | 0.2 | 0.2 | 0.2 | 0.2 | 0.2 | 0.2 |
| $SiO_2/Al_2O_3$ | 2.99 | 2.99 | 2.88 | 2.78 | 2.99 | 2.99 | 2.99 | 2.99 |
| CaO/BaO | 2.86 | 3.17 | 1.81 | 1.40 | 1.81 | 1.40 | 1.23 | 1.00 |
| Property α 30-380 ($\times 10^{-7}$/° C.) | 37.4 | 38.9 | 37.0 | 37.5 | 37.4 | 38.6 | 37.4 | 38.7 |
| Density (g/cm$^3$) | 2.528 | 2.546 | 2.543 | 2.572 | 2.540 | 2.571 | 2.552 | 2.586 |
| β-OH (mm$^{-1}$) | N.A. | N.A. | N.A. | N.A. | N.A. | N.A. | N.A. | 0.11 |
| HF etching rate (μm/min.) | 0.9 | N.A. | N.A. | N.A. | N.A. | N.A. | N.A. | N.A. |
| Ps (° C.) | 736 | 745 | 740 | 752 | 734 | 741 | 733 | 740 |
| Ta (° C.) | 795 | 803 | 799 | 812 | 793 | 800 | 792 | 799 |
| Ts (° C.) | 1,028 | 1,032 | 1,033 | 1,043 | 1,027 | 1,031 | 1,027 | 1,032 |
| $10^{4.5}$ dPa·s (° C.) | 1,279 | 1,281 | 1,286 | 1,294 | 1,282 | 1,283 | 1,283 | 1,284 |
| $10^{4.0}$ dPa·s (° C.) | 1,339 | 1,341 | 1,346 | 1,354 | 1,342 | 1,343 | 1,344 | 1,344 |
| $10^{3.0}$ dPa·s (° C.) | 1,499 | 1,498 | 1,504 | 1,510 | 1,499 | 1,503 | 1,503 | 1,504 |
| $10^{2.5}$ dPa·s (° C.) | 1,602 | 1,598 | 1,606 | 1,610 | 1,599 | 1,604 | 1,605 | 1,606 |
| TL (° C.) | 1,270 | 1,302 | 1,257 | 1,285 | 1,244 | 1,265 | 1,222 | 1,245 |
| Log η at TL (dPa·s) | 4.59 | 4.32 | 4.77 | 4.58 | 4.85 | 4.66 | 5.07 | 4.86 |
| Young's modulus (GPa) | 85.9 | 81.9 | 80.7 | 81.9 | 80.7 | 81.9 | 80.8 | 81.8 |
| Specific modulus (GPa/g·cm$^{-3}$) | 34.0 | 32.2 | 31.7 | 31.9 | 31.8 | 31.9 | 31.7 | 31.6 |

| Composition (mass %) | No. 9 | No. 10 | No. 11 | No. 12 | No. 13 | No. 14 | No. 15 | No. 16 |
|---|---|---|---|---|---|---|---|---|
| $SiO_2$ | 61.4 | 61.4 | 61.3 | 61.7 | 60.8 | 60.9 | 60.5 | 60.6 |
| $Al_2O_3$ | 20.5 | 20.5 | 20.4 | 20.3 | 20.9 | 21.0 | 20.8 | 20.9 |
| $B_2O_3$ | 4.0 | 3.5 | 3.5 | 3.5 | 3.1 | 3.1 | 3.1 | 3.1 |
| $Li_2O$ | 0.00 | 0.00 | 0.00 | 0.00 | 0.00 | 0.00 | 0.00 | 0.00 |
| $Na_2O$ | 0.00 | 0.00 | 0.00 | 0.00 | 0.00 | 0.00 | 0.00 | 0.02 |
| $K_2O$ | 0.00 | 0.00 | 0.00 | 0.00 | 0.00 | 0.00 | 0.00 | 0.00 |
| MgO | 1.0 | 1.0 | 1.6 | 1.6 | 1.9 | 2.2 | 1.6 | 1.9 |
| CaO | 7.0 | 7.0 | 5.7 | 5.3 | 5.7 | 5.3 | 5.7 | 5.2 |
| SrO | 2.5 | 2.5 | 2.4 | 2.4 | 2.4 | 2.4 | 3.2 | 3.2 |
| BaO | 2.7 | 2.7 | 5.0 | 4.9 | 4.9 | 5.0 | 4.9 | 4.9 |
| ZnO | 0.6 | 1.2 | 0.0 | 0.0 | 0.0 | 0.0 | 0.0 | 0.0 |
| $SnO_2$ | 0.2 | 0.2 | 0.2 | 0.2 | 0.2 | 0.2 | 0.2 | 0.2 |
| $SiO_2/Al_2O_3$ | 2.99 | 2.99 | 3.01 | 3.03 | 2.90 | 2.90 | 2.90 | 2.90 |
| CaO/BaO | 2.56 | 2.56 | 1.15 | 1.06 | 1.15 | 1.06 | 1.15 | 1.06 |
| Property α 30-380 ($\times 10^{-7}$/° C.) | 36.1 | 36.3 | 36.2 | 35.4 | 36.7 | 36.2 | 37.2 | 37.0 |
| Density (g/cm$^3$) | 2.523 | 2.539 | 2.549 | 2.542 | 2.558 | 2.559 | 2.568 | 2.568 |
| β-OH (mm$^{-1}$) | N.A. | N.A. | N.A. | N.A. | N.A. | N.A. | N.A. | N.A. |
| HF etching rate (μm/min.) | N.A. | N.A. | N.A. | N.A. | N.A. | N.A. | N.A. | N.A. |
| Ps (° C.) | 726 | 725 | 734 | 737 | 738 | 737 | 740 | 738 |
| Ta (° C.) | 785 | 784 | 794 | 797 | 797 | 796 | 799 | 797 |
| Ts (° C.) | 1,022 | 1,020 | 1,031 | 1,035 | 1,031 | 1,029 | 1,033 | 1,031 |
| $10^{4.5}$ dPa·s (° C.) | 1,281 | 1,279 | 1,289 | N.A. | N.A. | 1,280 | 1,280 | 1,282 |
| $10^{4.0}$ dPa·s (° C.) | 1,342 | 1,340 | 1,350 | N.A. | N.A. | 1,340 | 1,346 | 1,341 |
| $10^{3.0}$ dPa·s (° C.) | 1,502 | 1,498 | 1,508 | N.A. | N.A. | 1,499 | 1,506 | 1,498 |

TABLE 1-continued

| | | | | | | | | |
|---|---|---|---|---|---|---|---|---|
| $10^{2.5}$ dPa · s (° C.) | 1,605 | 1,599 | 1,612 | N.A. | N.A. | 1,599 | 1,605 | 1,600 |
| TL (° C.) | 1,239 | 1,232 | 1,246 | 1,274 | 1,264 | 1,281 | 1,243 | 1,260 |
| Log η at TL (dPa · s) | 4.88 | 4.93 | 4.89 | N.A. | N.A. | 4.49 | 4.85 | 4.70 |
| Young's modulus (GPa) | 80.3 | 81.2 | 80.4 | 80.2 | 81.6 | 82.0 | 81.3 | 81.4 |
| Specific modulus (GPa/g · cm$^{-3}$) | 31.8 | 32.0 | 31.5 | 31.6 | 31.9 | 32.0 | 31.7 | 31.7 |

TABLE 2

| Composition (mass %) | No. 17 | No. 18 | No. 19 | No. 20 | No. 23 | No. 24 | No. 25 |
|---|---|---|---|---|---|---|---|
| SiO$_2$ | 61.1 | 61.3 | 61.6 | 61.3 | 59.6 | 61.0 | 60.7 |
| Al$_2$O$_3$ | 20.3 | 20.3 | 20.2 | 20.3 | 20.0 | 18.2 | 19.8 |
| B$_2$O$_3$ | 3.1 | 2.6 | 2.2 | 2.1 | 1.1 | 1.1 | 2.4 |
| Li$_2$O | 0.00 | 0.00 | 0.00 | 0.00 | 0.00 | 0.00 | 0.00 |
| Na$_2$O | 0.02 | 0.02 | 0.02 | 0.02 | 0.02 | 0.02 | 0.02 |
| K$_2$O | 0.00 | 0.00 | 0.00 | 0.00 | 0.00 | 0.00 | 0.00 |
| MgO | 1.9 | 2.2 | 2.5 | 2.2 | 1.9 | 2.0 | 1.6 |
| CaO | 5.7 | 5.2 | 4.8 | 5.2 | 6.1 | 6.2 | 5.9 |
| SrO | 1.7 | 0.9 | 0.2 | 0.9 | 0.6 | 0.6 | 2.4 |
| BaO | 6.1 | 7.2 | 8.3 | 7.2 | 10.3 | 10.6 | 6.7 |
| ZnO | 0.0 | 0.0 | 0.0 | 0.6 | 0.0 | 0.0 | 0.0 |
| SnO$_2$ | 0.2 | 0.2 | 0.2 | 0.2 | 0.2 | 0.2 | 0.2 |
| SiO$_2$/Al$_2$O$_3$ | 3.01 | 3.02 | 3.04 | 3.02 | 2.98 | 3.35 | 3.07 |
| CaO/BaO | 0.93 | 0.73 | 0.58 | 0.73 | 0.59 | 0.59 | 0.89 |
| Property α 30-380 (×10$^{-7}$/° C.) | 37.3 | 36.9 | 36.6 | 37.7 | 40.2 | 40.6 | 38.1 |
| Density (g/cm$^3$) | 2.561 | 2.572 | 2.580 | 2.589 | 2.642 | 2.637 | 2.586 |
| β-OH (mm$^{-1}$) | N.A. | N.A. | N.A. | N.A. | 0 | 0 | 0 |
| HF etching rate (μm/min.) | N.A. | N.A. | N.A. | N.A. | N.A. | N.A. | N.A. |
| Ps (° C.) | 736 | 740 | 744 | 744 | 751 | 742 | 741 |
| Ta (° C.) | 794 | 799 | 804 | 804 | 810 | 801 | 800 |
| Ts (° C.) | 1,030 | 1,035 | 1,041 | 1,039 | 1,045 | 1,040 | 1,037 |
| $10^{4.5}$ dPa · s (° C.) | 1,295 | 1,295 | 1,301 | 1,299 | 1,300 | 1,303 | 1,296 |
| $10^{4.0}$ dPa · s (° C.) | 1,358 | 1,358 | 1,363 | 1,361 | 1,361 | 1,366 | 1,358 |
| $10^{3.0}$ dPa · s (° C.) | 1,518 | 1,524 | 1,524 | 1,521 | 1,519 | 1,531 | 1,519 |
| $10^{2.5}$ dPa · s (° C.) | 1,625 | 1,631 | 1,629 | 1,624 | 1,620 | 1,636 | 1,625 |
| TL (° C.) | 1,244 | 1,243 | 1,257 | 1,227 | 1,284 | 1,256 | 1,245 |
| Log η at TL (dPa · s) | 4.96 | 4.97 | 4.90 | 5.17 | 4.64 | 4.92 | 4.97 |
| Young's modulus (GPa) | 80.9 | 81.5 | 81.7 | 81.7 | 82.7 | 81.5 | 81.2 |
| Specific modulus (GPa/g · cm$^{-3}$) | 31.6 | 31.7 | 31.7 | 31.6 | 31.3 | 30.9 | 31.4 |

| Composition (mass %) | No. 26 | No. 27 | No. 28 | No. 29 | No. 30 | No. 31 | No. 32 |
|---|---|---|---|---|---|---|---|
| SiO$_2$ | 59.8 | 59.5 | 59.4 | 59.1 | 59.8 | 59.3 | 59.6 |
| Al$_2$O$_3$ | 19.7 | 18.9 | 18.9 | 19.7 | 19.9 | 19.7 | 19.1 |
| B$_2$O$_3$ | 2.4 | 2.4 | 2.4 | 2.5 | 2.0 | 2.0 | 2.0 |
| Li$_2$O | 0.00 | 0.00 | 0.00 | 0.00 | 0.00 | 0.00 | 0.00 |
| Na$_2$O | 0.02 | 0.03 | 0.02 | 0.02 | 0.02 | 0.02 | 0.02 |
| K$_2$O | 0.00 | 0.00 | 0.00 | 0.00 | 0.00 | 0.00 | 0.00 |
| MgO | 1.6 | 1.6 | 1.3 | 1.6 | 1.9 | 1.9 | 2.2 |
| CaO | 5.9 | 5.9 | 6.3 | 5.5 | 6.0 | 5.5 | 5.5 |
| SrO | 0.5 | 0.5 | 0.5 | 0.5 | 0.5 | 0.5 | 0.5 |
| BaO | 9.7 | 10.8 | 10.8 | 10.8 | 9.7 | 10.8 | 10.8 |
| ZnO | 0.0 | 0.0 | 0.0 | 0.0 | 0.0 | 0.0 | 0.0 |
| SnO$_2$ | 0.2 | 0.2 | 0.2 | 0.2 | 0.2 | 0.2 | 0.2 |
| SiO$_2$/Al$_2$O$_3$ | 3.04 | 3.15 | 3.14 | 3.00 | 3.01 | 3.01 | 3.12 |
| CaO/BaO | 0.61 | 0.55 | 0.59 | 0.51 | 0.62 | 0.51 | 0.51 |
| Property α 30-380 (×10$^{-7}$/° C.) | 38.4 | 39.6 | 40.0 | 38.7 | 38.8 | 38.9 | 39.4 |
| Density (g/cm$^3$) | 2.607 | 2.624 | 2.624 | 2.620 | 2.615 | 2.630 | 2.630 |
| β-OH (mm$^{-1}$) | 0.12 | 0 | 0 | 0 | 0 | 0 | 0 |
| HF etching rate (μm/min.) | N.A. | N.A. | N.A. | N.A. | N.A. | N.A. | N.A. |
| Ps (° C.) | 742 | 734 | 734 | 740 | 743 | 742 | 736 |
| Ta (° C.) | 802 | 794 | 794 | 800 | 802 | 802 | 796 |
| Ts (° C.) | 1,038 | 1,033 | 1,033 | 1,038 | 1,038 | 1,039 | 1,033 |
| $10^{4.5}$ dPa · s (° C.) | 1,300 | 1,294 | 1,294 | 1,298 | 1,298 | 1,301 | 1,294 |
| $10^{4.0}$ dPa · s (° C.) | 1,363 | 1,356 | 1,357 | 1,360 | 1,361 | 1,363 | 1,356 |
| $10^{3.0}$ dPa · s (° C.) | 1,525 | 1,521 | 1,522 | 1,522 | 1,526 | 1,525 | 1,520 |
| $10^{2.5}$ dPa · s (° C.) | 1,629 | 1,624 | 1,627 | 1,628 | 1,640 | 1,628 | 1,628 |
| TL (° C.) | 1,237 | 1,225 | 1,244 | 1,232 | 1,250 | 1,239 | 1,220 |
| Log η at TL (dPa · s) | 5.08 | 5.13 | 4.96 | 5.11 | 4.93 | 5.07 | 5.18 |
| Young's modulus (GPa) | 80.7 | 80.1 | 79.9 | 80.5 | 81.6 | 81.3 | 81.3 |
| Specific modulus (GPa/g · cm$^{-3}$) | 31.0 | 30.5 | 30.4 | 30.7 | 31.2 | 30.9 | 30.9 |

First, a glass batch prepared by blending glass raw materials so that each glass composition listed in the tables was attained was placed in a platinum crucible, and then melted at from 1,600° C. to 1,650° C. for 24 hours. When the glass batch was dissolved, molten glass was stirred to be homogenized by using a platinum stirrer. Next, the molten glass was poured on a carbon sheet and formed into a sheet shape, followed by being annealed at a temperature around an annealing point for 30 minutes. Each of the resultant samples was evaluated for its average thermal expansion coefficient α within a temperature range of from 30° C. to 380° C., density (Density), β-OH value, etching rate in HF (HF etching rate), strain point Ps, annealing point Ta, softening point Ts, temperature at a viscosity at high temperature of $10^{4.5}$ dPa·s, temperature at a viscosity at high temperature of $10^{4.0}$ dPa·s, temperature at a viscosity at high temperature of $10^{3.0}$ dPa·s, temperature at a viscosity at high temperature of $10^{2.5}$ dPa·s, liquidus temperature TL and liquidus viscosity log η at TL, Young's modulus (Young's modulus), and specific Young's modulus (Specific modulus).

The average thermal expansion coefficient α within a temperature range of from 30° C. to 380° C. is a value measured with a dilatometer.

The density is a value measured by a well-known Archimedes method.

The β-OH value is a value measured by the above-mentioned method.

The etching rate in HF is a value calculated from an etching depth when, after part of a surface of the resultant glass, which has been mirror polished, is masked with a polyimide tape, the glass is etched under the conditions of 30 minutes in a 5 mass % HF aqueous solution at 20° C.

The strain point Ps, the annealing point Ta, and the softening point Ts are values measured in accordance with methods of ASTM C336 and C338.

The temperatures at viscosities at high temperature of $10^{4.5}$ dPa·s, $10^{4.0}$ dPa·s, $10^{3.0}$ dPa·s, and $10^{2.5}$ dPa·s are values measured by a platinum sphere pull up method.

The liquidus temperature TL is a value obtained by measuring a temperature at which a crystal (initial phase) precipitates when glass powder which has passed through a standard 30-mesh sieve (sieve opening: 500 μm) and remained on a 50-mesh sieve (sieve opening: 300 μm) is placed in a platinum boat and kept for 24 hours in a gradient heating furnace.

The liquidus viscosity $\log_{10} \eta TL$ is a value obtained by measuring the viscosity of a glass at the liquidus temperature TL by a platinum sphere pull up method.

The Young's modulus is a value measured by a well-known resonance method. The specific Young's modulus is a value obtained by dividing the Young's modulus by the density.

As apparent from Tables 1 and 2, each of Sample Nos. 1 to 32 had small contents of alkali metal oxides, and had a strain point of 725° C. or more, a temperature at a viscosity at high temperature of $10^{2.5}$ dPa·s of 1,640° C. or less, a liquidus temperature of 1,302° C. or less, a viscosity at a liquidus temperature of $10^{4.32}$ dPa·s or more, and a specific Young's modulus of 30.4 GPa/g·cm$^{-3}$ or more. Therefore, it is considered that each of Sample Nos. 1 to 32 can be suitably used as a substrate for an OLED display.

The invention claimed is:

1. A glass, comprising as a glass composition, in terms of mass %, 55% to 70% of $SiO_2$, 18% to 25% of $Al_2O_3$, 1% to 5% of $B_2O_3$, 0% to 0.5% of $Li_2O+Na_2O+K_2O$, 0% to 4% of MgO, 3% to 11% of CaO, 0% to 4% of SrO, 0% to 11% of BaO, 0.001% to 1% of $SnO_2$, and 0% to 1.5% of $P_2O_5$, and having a ratio of $SiO_2/Al_2O_3$ in terms of mass % of from 2.5 to 3.1 and a strain point of more than 715° C.

2. The glass according to claim 1, comprising as a glass composition, in terms of mass %, 1.5% to 4% of $B_2O_3$, 0% to less than 0.1% of $Li_2O+Na_2O+K_2O$, 0% to 3% of MgO, 4% to 10% of CaO, 1% to 4% of SrO, and 4% to 11% of BaO.

3. The glass according to claim 1, wherein the glass has a ratio of CaO/BaO in terms of mass % of 4.0 or less.

4. The glass according to claim 1, wherein the glass has a specific Young's modulus of more than 29.5 GPa/g·cm$^{-3}$.

5. The glass according to claim 1, wherein the glass has a temperature at a viscosity at high temperature of $10^{2.5}$ dPa·s of 1,650° C. or less.

6. The glass according to claim 1, wherein the glass has a liquidus temperature of less than 1,310° C.

7. The glass according to claim 1, wherein the glass has a viscosity at a liquidus temperature of $10^{4.2}$ dPa·s or more.

8. The glass according to claim 1, wherein the glass has a flat sheet shape and comprises overflow-joined surfaces in a middle portion thereof in a sheet thickness direction.

9. The glass according to claim 1, wherein the glass is used for an OLED device.

* * * * *